United States Patent
Yamazaki et al.

(10) Patent No.: US 8,772,795 B2
(45) Date of Patent: Jul. 8, 2014

(54) LIGHT-EMITTING DEVICE AND LIGHTING DEVICE

(75) Inventors: Shunpei Yamazaki, Tokyo (JP); Koji Ono, Tochigi (JP); Yoshifumi Tanada, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 96 days.

(21) Appl. No.: 13/367,643

(22) Filed: Feb. 7, 2012

(65) Prior Publication Data

US 2012/0205675 A1 Aug. 16, 2012

(30) Foreign Application Priority Data

Feb. 14, 2011 (JP) ................. 2011-028854

(51) Int. Cl.
*H01L 27/15* (2006.01)

(52) U.S. Cl.
USPC 257/88; 257/79; 257/E21.001; 257/E21.119; 257/E21.115; 257/E25.032; 257/E27.12; 257/E51.018; 257/E21.211; 257/E51.001; 313/504; 313/505; 326/82; 445/24; 345/80; 345/76; 345/55; 438/30; 438/28; 315/294; 349/96; 349/117

(58) Field of Classification Search
CPC ..... H01L 27/12; H01L 27/13; H01L 27/3209; H01L 27/3281; H01L 51/0058; H01L 51/5036
USPC ................. 445/24; 313/504; 326/82; 257/88, 257/E27.12, E51.018, E21.211, E51.001, 257/79, E21.001, E33.001, E25.032, 257/E21.115, E21.119; 345/80; 438/30, 28
See application file for complete search history.

(56) References Cited

U.S. PATENT DOCUMENTS

| 2,972,692 | A | 2/1961 | William et al. |
| 3,833,833 | A | 9/1974 | Nelson |

(Continued)

FOREIGN PATENT DOCUMENTS

| EP | 0 597 226 A1 | 5/1994 |
| EP | 0 895 219 A1 | 2/1999 |

(Continued)

OTHER PUBLICATIONS

Tokito et al., "Metal Oxides as a Hole-Injecting Layer for an Organic Electroluminescent Device," J. Phys. D: Appl. Phys. (Journal of Physics D: Applied Physics), 1996, vol. 29, pp. 2750-2753.

*Primary Examiner* — Jerome Jackson, Jr.
*Assistant Examiner* — Bo Fan
(74) *Attorney, Agent, or Firm* — Eric J. Robinson; Robinson Intellectual Property Law Office, P.C.

(57) ABSTRACT

To provide a light-emitting device including the plurality of light-emitting elements having a structure in which a light-emitting area is large and defects in patterning of light-emitting elements are suppressed. To provide a lighting device including the light-emitting device. The light-emitting device includes a first wiring provided over a substrate having an insulating surface, an insulating film provided over the first wiring, a second wiring provided over the insulating film, and a light-emitting element unit including a plurality of light-emitting elements provided over the first wiring with the insulating film provided therebetween. The plurality of light-emitting elements each include a first electrode layer having a light-blocking property, a layer containing an organic compound in contact with the first electrode layer, and a second electrode layer having a light-transmitting property in contact with the layer containing an organic compound. The layers containing an organic compound are separated by a separation layer.

22 Claims, 8 Drawing Sheets

(56) References Cited

U.S. PATENT DOCUMENTS

| | | |
|---|---|---|
| 4,298,869 A | 11/1981 | Okuno |
| 5,939,839 A | 8/1999 | Robel et al. |
| 6,157,127 A | 12/2000 | Hosokawa et al. |
| 6,335,713 B1 | 1/2002 | Imai |
| 6,462,722 B1 | 10/2002 | Kimura et al. |
| 6,522,315 B2 | 2/2003 | Ozawa et al. |
| 6,693,296 B1 | 2/2004 | Tyan |
| 6,717,358 B1 | 4/2004 | Liao et al. |
| 6,747,639 B2 | 6/2004 | So |
| 6,839,045 B2 | 1/2005 | Ozawa et al. |
| 7,005,196 B1 | 2/2006 | Carter et al. |
| 7,012,585 B2 | 3/2006 | Agostinelli et al. |
| 7,068,418 B2 | 6/2006 | Kawase |
| 7,148,632 B2 | 12/2006 | Berman et al. |
| 7,180,483 B2 | 2/2007 | Kimura et al. |
| 7,199,516 B2 | 4/2007 | Seo et al. |
| 7,221,339 B2 | 5/2007 | Ozawa et al. |
| 7,253,793 B2 | 8/2007 | Ozawa et al. |
| 7,255,939 B2 | 8/2007 | Carter et al. |
| 7,271,785 B2 | 9/2007 | Jang |
| 7,285,801 B2 | 10/2007 | Eliashevich et al. |
| 7,322,718 B2 | 1/2008 | Setomoto et al. |
| 7,468,580 B2 | 12/2008 | Kawase |
| 7,710,364 B2 | 5/2010 | Ozawa et al. |
| 7,834,543 B2 | 11/2010 | Takata |
| 7,888,864 B2 | 2/2011 | Young |
| 7,999,463 B2 | 8/2011 | Nomura |
| 2002/0196206 A1 | 12/2002 | Kimura et al. |
| 2003/0048072 A1 | 3/2003 | Ishihara et al. |
| 2003/0098827 A1 | 5/2003 | Ozawa et al. |
| 2003/0117348 A1 | 6/2003 | Knapp et al. |
| 2003/0122805 A1 | 7/2003 | So |
| 2003/0141807 A1 | 7/2003 | Kawase |
| 2003/0151360 A1 | 8/2003 | Fukunaga et al. |
| 2003/0170491 A1 | 9/2003 | Liao et al. |
| 2003/0189401 A1 | 10/2003 | Kido et al. |
| 2003/0227253 A1 | 12/2003 | Seo et al. |
| 2003/0231273 A1 | 12/2003 | Kimura et al. |
| 2004/0021425 A1 | 2/2004 | Foust et al. |
| 2004/0031957 A1 | 2/2004 | Tyan |
| 2004/0032220 A1 | 2/2004 | Cok et al. |
| 2004/0150591 A1 | 8/2004 | Ozawa et al. |
| 2005/0077838 A1 | 4/2005 | Blumel |
| 2005/0174064 A1 | 8/2005 | Agostinelli et al. |
| 2005/0218791 A1 | 10/2005 | Kawase |
| 2005/0225973 A1 | 10/2005 | Eliashevich et al. |
| 2006/0119253 A1 | 6/2006 | Carter et al. |
| 2006/0250558 A1 | 11/2006 | Burns et al. |
| 2006/0273995 A1 | 12/2006 | Ozawa et al. |
| 2006/0273996 A1 | 12/2006 | Ozawa et al. |
| 2006/0279491 A1 | 12/2006 | Ozawa et al. |
| 2007/0171145 A1 | 7/2007 | Coleman et al. |
| 2007/0182317 A1 | 8/2007 | Kido et al. |
| 2008/0001512 A1 | 1/2008 | Nomura |
| 2008/0179602 A1 | 7/2008 | Negley et al. |
| 2008/0211416 A1 | 9/2008 | Negley et al. |
| 2008/0246704 A1 | 10/2008 | Kawase |
| 2009/0189515 A1 | 7/2009 | Halls et al. |
| 2010/0039023 A1 | 2/2010 | Rogojevic et al. |
| 2010/0277403 A1* | 11/2010 | Chao et al. ............ 345/80 |
| 2011/0037054 A1 | 2/2011 | Shieh et al. |
| 2011/0089814 A1 | 4/2011 | Nomura |
| 2011/0089823 A1 | 4/2011 | Nomura |
| 2011/0101388 A1 | 5/2011 | Nomura |
| 2011/0140617 A1 | 6/2011 | Nomura |
| 2011/0260646 A1 | 10/2011 | Moon et al. |
| 2012/0062108 A1 | 3/2012 | Mima |
| 2012/0161165 A1 | 6/2012 | Yamazaki |
| 2012/0161167 A1 | 6/2012 | Yamazaki |
| 2012/0161174 A1 | 6/2012 | Yamazaki |
| 2012/0205634 A1 | 8/2012 | Ikeda et al. |

FOREIGN PATENT DOCUMENTS

| | | |
|---|---|---|
| EP | 0 917 127 A1 | 5/1999 |
| EP | 1 255 240 A1 | 11/2002 |
| EP | 1 336 953 A2 | 8/2003 |
| EP | 1 337 131 A2 | 8/2003 |
| EP | 1 359 789 A1 | 11/2003 |
| EP | 1 363 265 A2 | 11/2003 |
| EP | 1 388 894 A2 | 2/2004 |
| EP | 1 619 654 A1 | 1/2006 |
| JP | 06-208342 A | 7/1994 |
| JP | 11-273856 A | 10/1999 |
| JP | 11-307261 A | 11/1999 |
| JP | 2000-029404 A | 1/2000 |
| JP | 2002-132218 A | 5/2002 |
| JP | 2002-532848 | 10/2002 |
| JP | 2004-069774 A | 3/2004 |
| JP | 2004-234868 A | 8/2004 |
| JP | 2005-235491 | 9/2005 |
| JP | 2005-235491 A | 9/2005 |
| JP | 2006-049853 | 2/2006 |
| JP | 2006-049853 A | 2/2006 |
| JP | 2006-108651 | 4/2006 |
| JP | 2009-130132 | 6/2009 |
| WO | WO 98/36406 | 8/1998 |
| WO | WO 00/36662 | 6/2000 |
| WO | WO 03/037040 | 5/2003 |
| WO | WO 2004/044987 | 5/2004 |

* cited by examiner

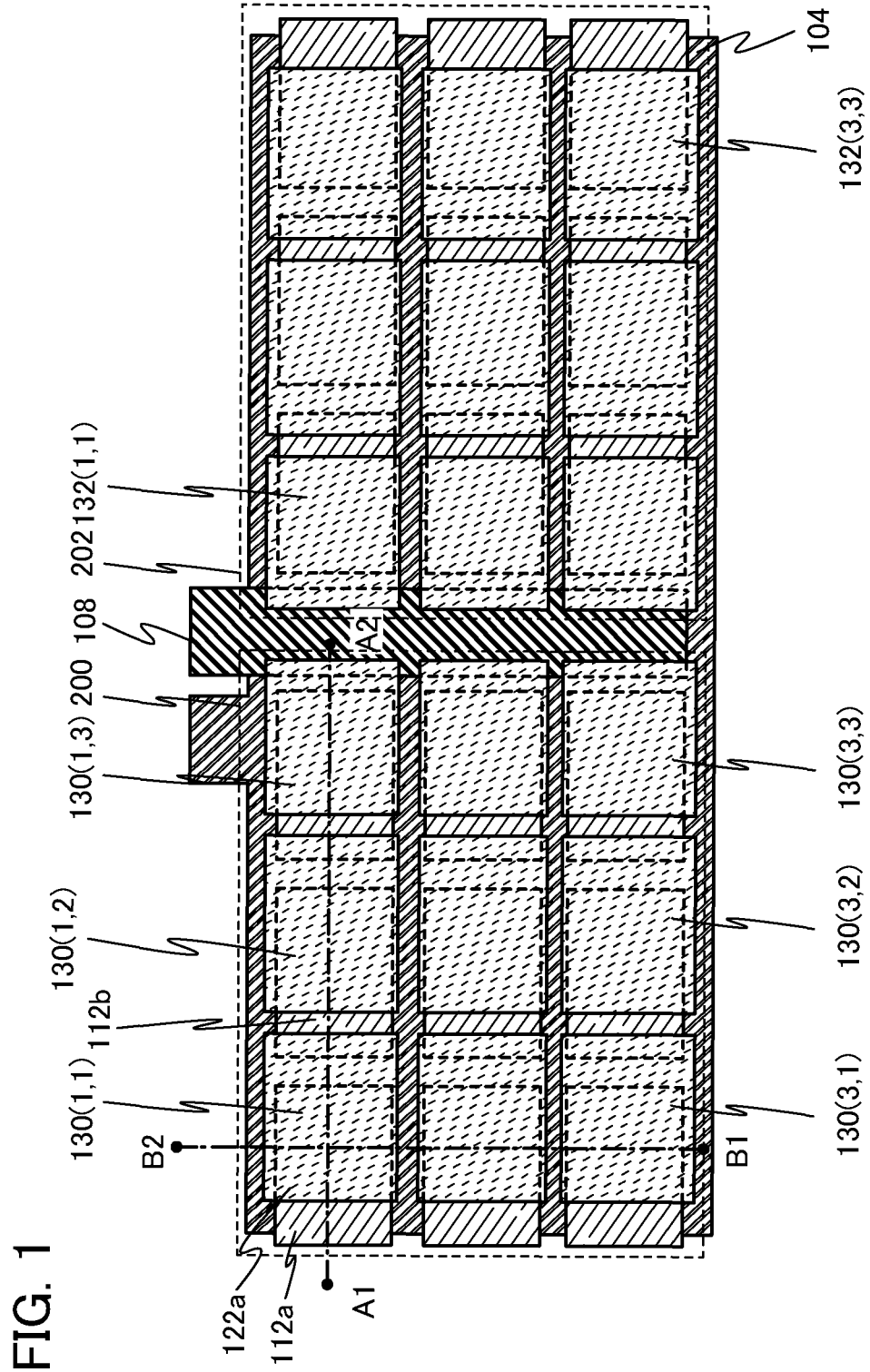

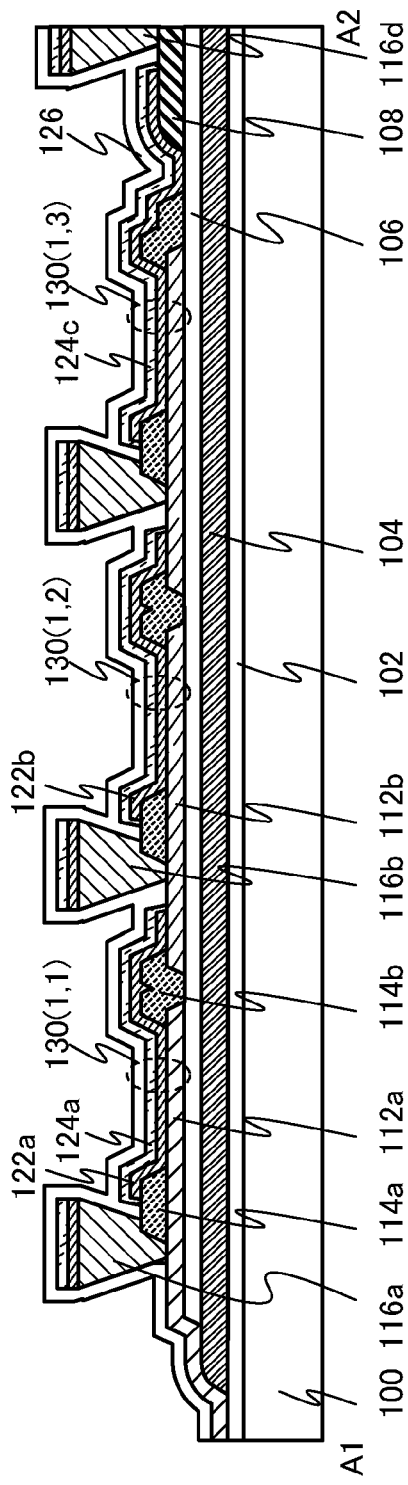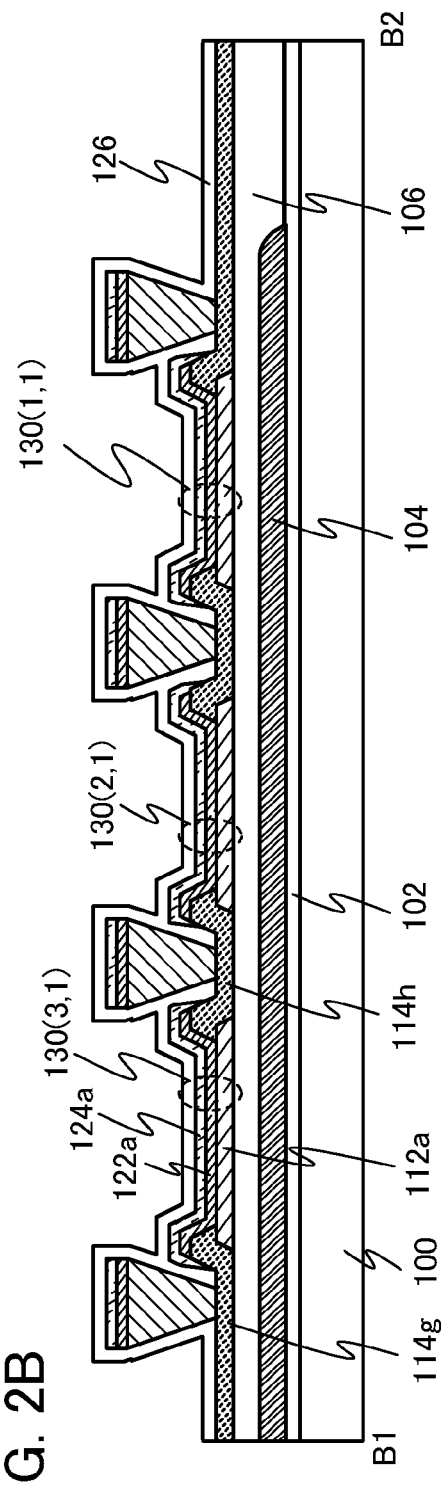

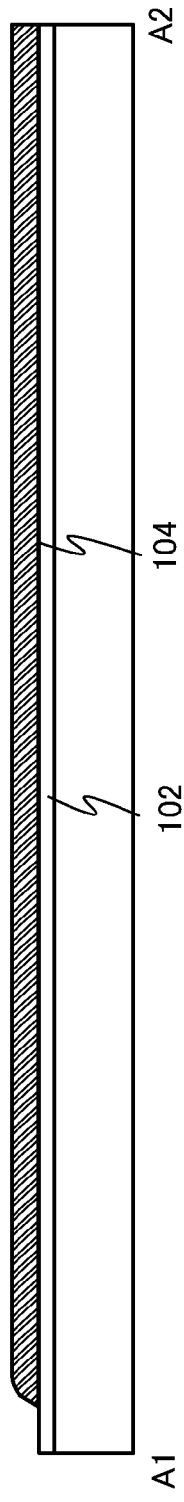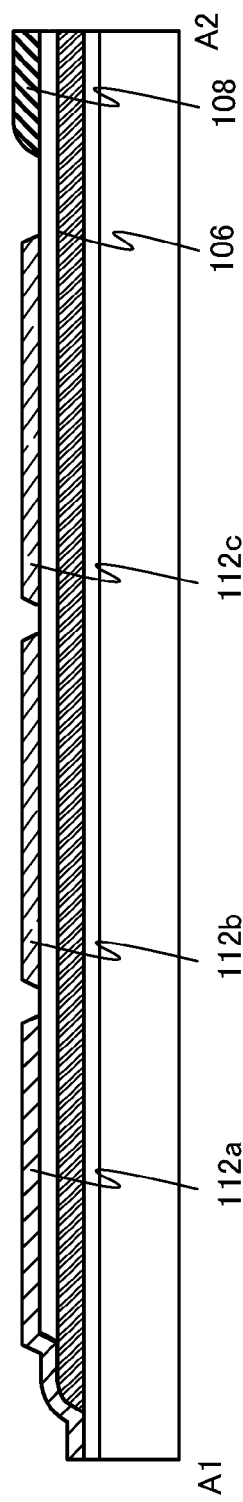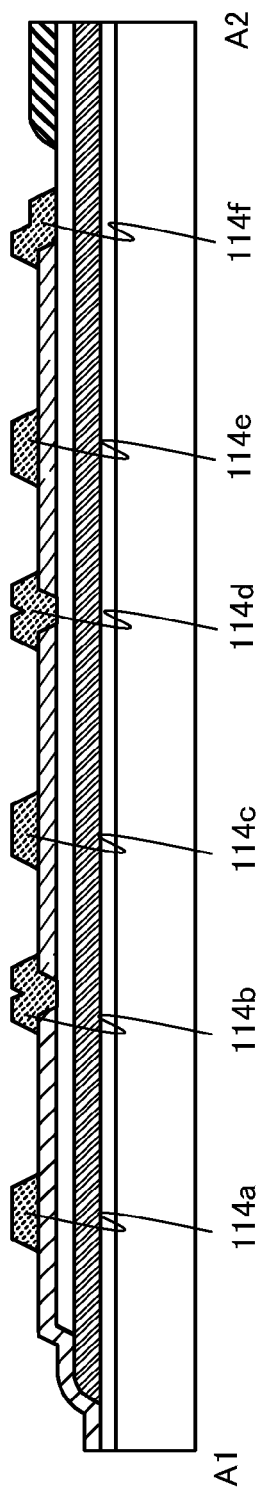

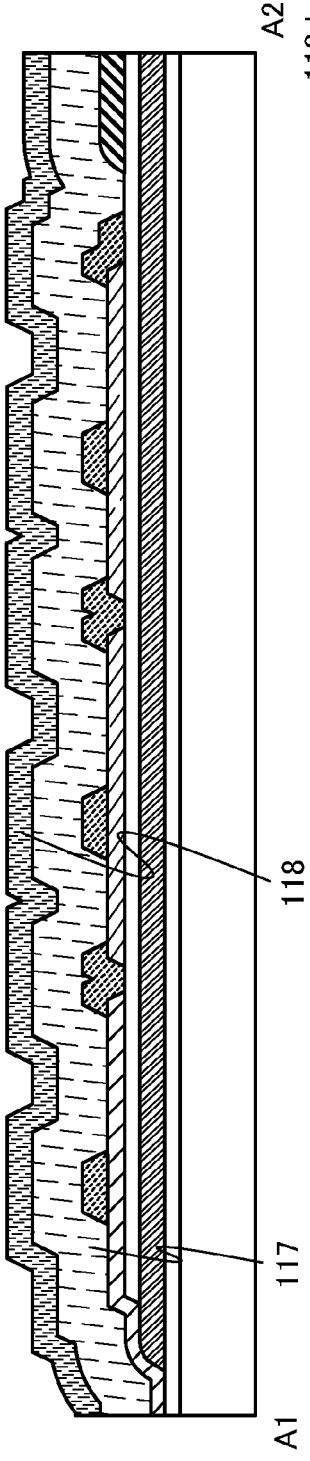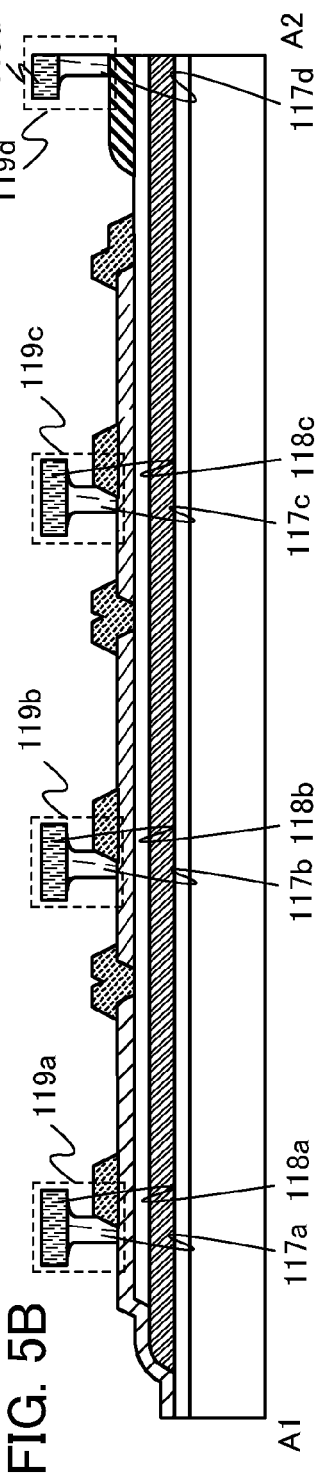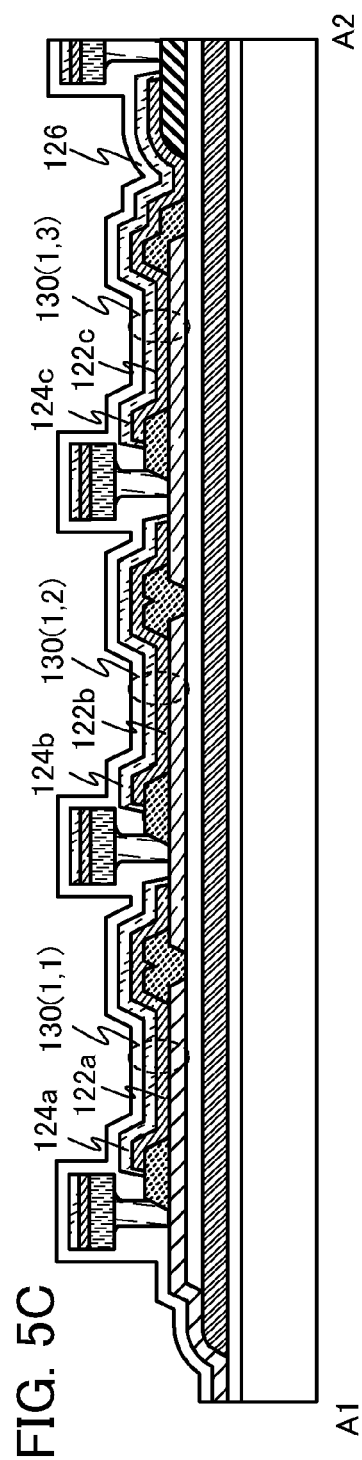

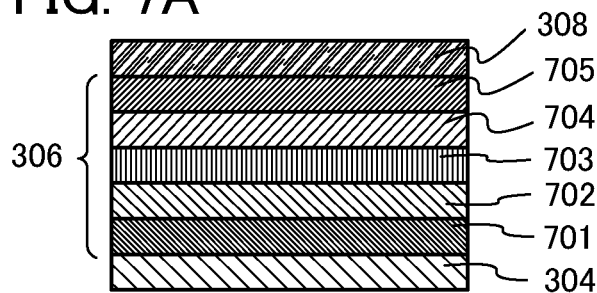
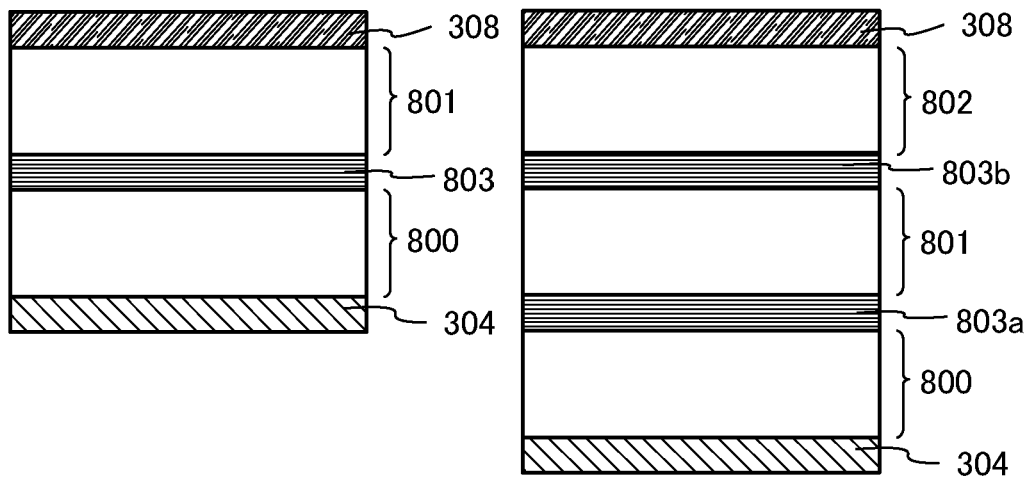
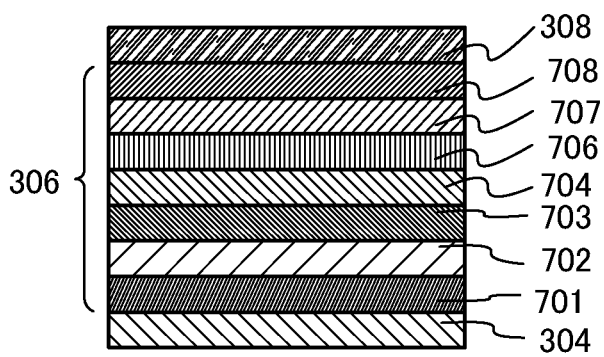

LIGHT-EMITTING DEVICE AND LIGHTING DEVICE

BACKGROUND OF THE INVENTION

1. Field of the Invention

The present invention relates to a light-emitting element unit including a plurality of light-emitting elements utilizing organic electroluminescence (EL) (hereinafter, also referred to as an organic EL element). The present invention also relates to a light-emitting device and a lighting device each including the light-emitting element unit.

2. Description of the Related Art

An organic EL element has a structure in which a layer containing a light-emitting organic compound is interposed between a pair of electrodes. By applying voltage to this element, light emission from the light-emitting organic compound can be obtained. In recent years, the organic EL element has been expected to be applied to a light source of a lighting device.

In Patent Document 1, a lighting device having a structure in which a plurality of organic EL elements are connected in series is disclosed. With the use of a plurality of organic EL elements, a lighting device with a large light-emitting area can be manufactured.

REFERENCE

[Patent Document 1] Japanese Published Patent Application No. 2009-130132

SUMMARY OF THE INVENTION

In the case where a lighting device is formed using a plurality of light-emitting elements, the plurality of light-emitting elements are connected to one another by a lead wiring. Even when a low resistance metal is used, the lead wiring is long and the resistance thereof is increased; therefore, the width of the lead wiring needs to be larger than that of a wiring used in a light-emitting region. When the width of the lead wiring is increased, the light-emitting area in the light-emitting region is reduced or the aperture ratio is decreased.

Further, in the case where a lighting device is formed by aligning a plurality of light-emitting elements, an anode, a layer containing a light-emitting organic compound, and a cathode need to be patterned with a metal mask for forming a light-emitting element in a vacuum evaporation apparatus. Patterning with a metal mask has a problem of causing defects in patterning caused by bending or warping of a metal mask. In addition, a particle attached to the metal mask might be transferred from the metal mask to the substrate. Thus, the yield is decreased, which leads to an increase of manufacturing cost.

The present invention aims to solve at least one of the above-described problems. In other words, it is an object of the present invention to provide a light-emitting device including a plurality of light-emitting elements having a structure in which a light-emitting area is large and defects in patterning of the light-emitting elements are suppressed and a manufacturing method of the light-emitting device. It is another object of the present invention to provide a lighting device including the light-emitting device and a manufacturing method thereof.

One embodiment of the present invention is a light-emitting device including a first wiring provided over a substrate having an insulating surface, an insulating film provided over the first wiring, a second wiring provided over the insulating film, and a plurality of light-emitting elements provided over the first wiring with the insulating film provided therebetween. The plurality of light-emitting elements each include a first electrode layer having a light-blocking property, a layer containing an organic compound in contact with the first electrode layer, and a second electrode layer having a light-transmitting property in contact with the layer containing an organic compound. The layers containing an organic compound are separated by a separation layer.

In the above structure, the plurality of light-emitting elements may be connected in series to form a light-emitting element row. Further, a plurality of light-emitting element rows may be provided and connected in parallel.

In any of the above structures, the separation layer has an inverse tapered shape in which the width of a side in contact with a surface where the separation layer is formed is smaller than the width of the opposite side in a cross section. A taper angle of the separation layer (an angle between the side in contact with a surface where the separation layer is formed and a sidewall of the separation layer) θ is preferably greater than or equal to 100° and less than or equal to 130°. The separation layer may have a T shape.

In any of the above structures, the substrate having an insulating surface preferably has thermal conductivity.

In any of the above structures, the first wiring and the second wiring are preferably formed by a printing method.

In any of the above structures, light emitted from the plurality of light-emitting elements is preferably extracted through the second electrode layer.

A lighting device can be formed using a light-emitting device having any of the above structures.

Note that in this specification, a lighting device includes a light-emitting element including at least a light-emitting layer between a pair of electrodes. Further, the lighting device includes the following modules in its category: a module in which a connector such as a flexible printed circuit (FPC), a tape automated bonding (TAB) tape, or a tape carrier package (TCP) is attached to a lighting device; and a module having a TAB tape or a TCP provided with a converter or the like at the end thereof.

According to one embodiment of the present invention, a light-emitting device including a plurality of light-emitting elements having a structure in which a light-emitting area is large and defects in patterning of the light-emitting elements are suppressed and a manufacturing method of the light-emitting device can be provided. A lighting device including the light-emitting device and a manufacturing method thereof can be provided.

BRIEF DESCRIPTION OF THE DRAWINGS

FIG. 1 is a plan view illustrating a light-emitting device according to one embodiment of the present invention.

FIGS. 2A and 2B are cross-sectional views each illustrating a light-emitting device according to one embodiment of the present invention.

FIGS. 3A to 3C are cross-sectional views illustrating a method for manufacturing a light-emitting device according to one embodiment of the present invention.

FIGS. 5A to 5C are cross-sectional views illustrating a method for manufacturing a light-emitting device according to one embodiment of the present invention.

FIGS. 7A, 7B1, 7B2, and 7C are diagrams each illustrating an example of a layer containing an organic compound.

DETAILED DESCRIPTION OF THE INVENTION

Figure 4A:
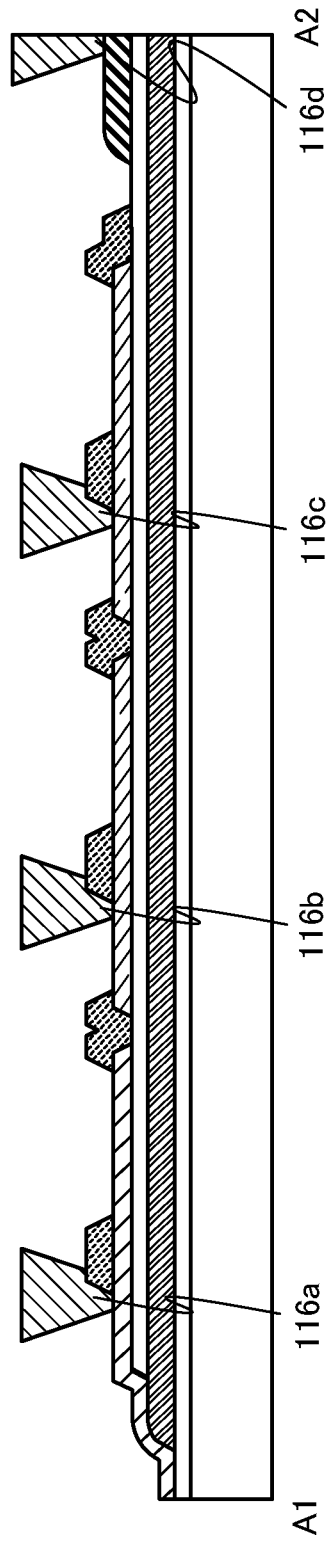
FIGS. 4A and 4B are cross-sectional views illustrating a method for manufacturing a light-emitting device according to one embodiment of the present invention.

Embodiments will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the following descriptions of the embodiments. In the structures to be given below, the same portions or portions having similar functions are denoted by the same reference numerals in different drawings, and descriptions thereof will not be repeated.

Embodiment 1

In this embodiment, a light-emitting device according to one embodiment of the present invention is described with reference to FIG. 1 and FIGS. 2A and 2B.

FIG. 1 is an enlarged plan view of part of the light-emitting device according to one embodiment of the present invention. Note that in FIG. 1, only wirings and electrodes are illustrated and an insulating film and the like are omitted.

The light-emitting device according to one embodiment of the present invention includes a light-emitting element unit 200 and a light-emitting element unit 202. The light-emitting element unit 200 and the light-emitting element unit 202 are connected to a converter (not illustrated) through a first wiring 104 and a second wiring 108. The converter is provided to convert high voltage input from an external commercial power supply (e.g., approximately 100 V to 240 V) to voltage at which a light-emitting element is driven (e.g., approximately 3 V to several tens of volts). Different voltages are output to the first wiring 104 and the second wiring 108 which are connected to the converter. The light-emitting element unit 200 and the light-emitting element unit 202 emit light when current flows because of a potential difference between the first wiring 104 and the second wiring 108. In this embodiment, the case where the light-emitting device includes two light-emitting element units is described; however, the number of light-emitting element units may be determined depending on output characteristics of the converter, a layout, or the like as appropriate.

The light-emitting element unit 200 includes nine light-emitting elements that are arranged in a matrix with three rows and three columns. In this specification and the like, a position of a light-emitting element is expressed by a light-emitting element 130(*m, n*) (m represents the number of rows and n represents the number of columns. m and n each are larger than or equal to 1.). In other words, a light-emitting element in the m-th row and the n-th column is denoted by a light-emitting element 130(*m, n*). Similarly, the light-emitting element unit 202 includes nine light-emitting elements that are arranged in a matrix with three rows and three columns. In the light-emitting element unit 202, a light-emitting element in the m-th row and the n-th column is denoted by a light-emitting element 132(*m, n*). When they emit light at the same time, the light-emitting device can be used as a surface light source. In this embodiment, the case where the light-emitting element unit includes nine light-emitting elements is described; however, the number of light-emitting elements may be determined depending on output characteristics of the converter, a layout, or the like as appropriate.

In the light-emitting element unit 200, the nine light-emitting elements 130(1, 1) to 130(3, 3) are connected in series in each row. In other words, in the first row, the light-emitting elements 130(1, 1), 130(1, 2), and 130(1, 3) are connected in series in this order. Similarly, in the second row, the light-emitting elements 130(2, 1), 130(2, 2), and 130(2, 3) are connected in series in this order, and in the third row, the light-emitting elements 130(3, 1), 130(3, 2), and 130(3, 3) are connected in series in this order. In this specification and the like, a plurality of light-emitting elements connected in series as described above are also called a light-emitting element row. In other words, it can be said that the light-emitting element unit 200 includes three light-emitting element rows.

Further, the three light-emitting element rows are connected in parallel in a column direction. By connecting a plurality of light-emitting element rows in parallel in such a manner, even when a light-emitting element in the light-emitting element unit is a short circuit or an open circuit, other light-emitting element rows connected in parallel are not affected and light can be continuously emitted.

In the light-emitting element unit 200 in FIG. 1, the light-emitting elements 130(1, 1), 130(2, 1), and 130(3, 1) in the first column are electrically connected to the first wiring 104, and the light-emitting elements 130(1, 3), 130(2, 3), and 130(3, 3) in the third column are electrically connected to the second wiring 108. In FIG. 1, the light-emitting elements 130(1, 1), 130(2, 1), and 130(3, 1) in the first column is at the end of the light-emitting element unit 200 on a high potential side, and the light-emitting elements 130(1, 3), 130(2, 3), and 130(3, 3) in the third column is at the end of the light-emitting element unit 200 on a low potential side.

In the light-emitting element unit 202, the light-emitting elements 132(1, 3), 132(2, 3), and 132(3, 3) in the third column are electrically connected to the first wiring 104, and the light-emitting elements 132(1, 1), 132(2, 1), and 132(3, 1) in the first column are electrically connected to the second wiring 108. In FIG. 1, the light-emitting elements 132(1, 3), 132(2, 3), and 130(3, 3) in the third column is at the end of the light-emitting element unit 202 on a high potential side, and the light-emitting elements 132(1, 1), 132(2, 1), and 132(3, 1) in the first column is at the end of the light-emitting element unit 202 on a low potential side.

As described above, the light-emitting element unit 200 and the light-emitting element unit 202 are provided so as to be symmetrical to each other. With such a structure, a layout in which wirings on the high voltage side or the low voltage side are shared can be used, for example; therefore, a space between the light-emitting element units can be reduced. Thus, a light-emitting area to a substrate area can be increased.

According to one embodiment of the present invention, a light-emitting element unit can have a structure in which two or more light-emitting element rows each including a plurality of light-emitting elements connected in series are connected in parallel. When a given number of such light-emitting element units are provided in parallel, the area of the light-emitting device can be increased.

FIG. 2A is a cross-sectional view taken along line A1-A2 in FIG. 1 and FIG. 2B is a cross-sectional view taken along line B1-B2 in FIG. 1.

As illustrated in FIG. 2A, an insulating film 102 is provided over a substrate 100, the first wiring 104 is provided over the insulating film 102, an insulating film 106 is provided over the first wiring 104, and the second wiring 108 and the light-emitting elements 130(1, 1), 130(1, 2), and 130(1, 3) are provided over the insulating film 106. Further, as illustrated in FIG. 2B, the insulating film 102 is provided over the substrate 100, the first wiring 104 is provided over the insulating film 102, the insulating film 106 is provided over the first wiring 104, and the light-emitting elements 130(1, 1), 130(2, 1), and 130(3, 1) are provided over the insulating film 106.

As the substrate 100, a glass substrate, a quartz substrate, a plastic (organic resin) substrate, a metal substrate, or the like can be used, for example. For a metal substrate, metal such as aluminum, copper, or nickel, or an alloy such as duralumin or a stainless steel can be used.

When an organic resin is used for the substrate 100, for example, a polyester resin such as polyethylene terephthalate (PET) or polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, or the like can be used as an organic resin. Further, a substrate in which a glass fiber is impregnated with an organic resin or a substrate in which an inorganic filler is mixed with an organic resin can also be used.

With the use of a metal substrate or the like as the substrate 100, entry of moisture, an impurity, or the like into an organic compound and a metal material which are contained in the light-emitting element from the outside of the light-emitting device can be suppressed. Consequently, as well as a light-emitting device can have resistance against bending and breaking, deterioration of the light-emitting element due to moisture, an impurity, or the like can be suppressed. Therefore, the reliability of the light-emitting device is improved.

When a plastic substrate or a metal substrate is used as the substrate 100, the light-emitting device can have resistance against an impulse such as a drop impulse.

When the thickness of the substrate 100 is greater than or equal to 10 μm and less than or equal to 200 μm, the light-emitting device can be thin and light.

With the use of the substrate 100 having a large area of 720 mm×600 mm, 750 mm×620 mm, or the like, the area of the light-emitting device can be increased.

In the case where a light-emitting device including an organic EL element is used as a light source of a lighting device, higher luminance is needed as compared to a display and the amount of heat generation is increased, so that the temperature of the light-emitting element is increased. In the light-emitting element, there is a portion where leakage current occurs, so that temperature is locally increased because of Joule heat. Since a large amount of current flows by an increase in temperature in the light-emitting element, the temperature is further increased. Thus, the quality of the portion is modified, resulting in a short circuit. Further, the increase in temperature causes deterioration of a layer containing an organic compound of a light-emitting element, resulting in a short circuit.

With a metal substrate having thermal conductivity as the substrate 100, even when the light-emitting element generates heat, the heat can be conducted to a rear surface of the substrate 100. Thus, deterioration of the light-emitting element due to an increase in temperature is suppressed, so that the reliability of the lighting device can be increased.

The insulating film 102 serves as a base film. The insulating film 102 is formed to a thickness of greater than or equal to 50 nm and less than or equal to 300 nm using a single layer or a stacked layer of silicon oxide, silicon oxynitride, silicon nitride oxide, silicon nitride, aluminum oxide, magnesium oxide, or the like by a sputtering method, a CVD method, or the like. In the case where the insulating film 102 is a stacked layer, a silicon oxynitride film may be formed over a silicon nitride oxide film.

The first wiring 104 and the second wiring 108 are formed by a CVD method, a sputtering method, a printing method such as a screen printing method or a gravure printing method, a plating treatment method, or the like. For the first wiring 104 and the second wiring 108, a low resistance material may be used; for example, they are each formed to have a single layer or a stacked layer of a material selected from aluminum, titanium, tantalum, tungsten, molybdenum, chromium, neodymium, scandium, nickel, and copper, or an alloy material containing the above material as its main component. The first wiring 104 and the second wiring 108 each have a thickness of greater than or equal to 3 μm and less than or equal to 30 μm.

For example, when the first wiring 104 and the second wiring 108 are formed using a printing method, a conductive paste in which conductive particles having a diameter of several nanometers to several tens of nanometers are solved or dispersed into an organic resin may be selectively printed. As the conductive particles, metal particles of one or more of silver, gold, copper, nickel, platinum, palladium, tantalum, molybdenum, and titanium; fine particles of silver halide; or dispersive nanoparticles can be used. By using a printing method for the first wiring 104 and the second wiring 108, the process can be simplified and the cost can be reduced.

The insulating film 106 serves as a planarization film. The insulating film 106 can be formed using an inorganic insulating material or an organic insulating material. For example, an organic insulating material having heat resistance such as an acrylic resin, polyimide, a benzocyclobutene-based resin, polyamide, an epoxy resin, or a phenol resin is preferably used as a planarization film. Other than such organic insulating materials, it is possible to use a low-dielectric constant material (a low-k material), a siloxane-based resin, phosphosilicate glass (PSG), borophosphosilicate glass (BPSG), or the like. Alternatively, the insulating film 106 may be formed by stacking a plurality of insulating films formed using any of these materials. The thickness of the insulating film 106 is greater than or equal to 1.0 μm and less than or equal to 30 μm.

There is no particular limitation on the method for forming the insulating film 106, and the insulating film 106 can be formed, depending on a material thereof, by a sputtering method, a spin coating method, a dipping method, a printing method, an inkjet method, or the like.

As the light-emitting element forming the light-emitting element unit, an organic EL element can be used. When the light-emitting device is formed using an organic EL element, one of a pair of electrodes of the light-emitting element is formed using a light-transmitting conductive material. A conductive material having a light-transmitting property, such as indium tin oxide (hereinafter, also referred to as ITO) has a resistance value larger than that of a metal material used for a wiring or the like, such as aluminum or titanium. Thus, when a lead wiring is formed using a conductive material having a light-transmitting property, a voltage drop is likely to be caused.

Therefore, in the case of a bottom emission type (lower surface emission type) in which light emitted from the light-emitting element is extracted from the first electrode layer 112a side, when a lead wiring is formed between the substrate 100 and the light-emitting element unit 200, the lead wiring is formed using a metal material. However, in the case of the bottom emission type, when the lead wiring having a light-blocking property is provided between the substrate 100 and the light-emitting element unit 200, the light-emitting area is reduced or the aperture ratio is decreased.

Thus, in one embodiment of the present invention, a top emission type (upper surface emission type) is used in which light emitted from the light-emitting element is extracted from a second electrode layer 124a side. The light-emitting element 130(1, 1) in FIG. 2A includes the first electrode layer 112a having a light-blocking property, a layer 122a containing an organic compound in contact with the first electrode layer 112a, and the second electrode layer 124a having a light-transmitting property in contact with the layer 122a containing an organic compound. Accordingly, a lead wiring having a light-blocking property can be provided between the substrate 100 and the light-emitting element unit 200. Even when the width of the lead wiring is larger than that of the light-emitting element unit 200, the light-emitting area can be large or the aperture ratio can be improved.

The first electrode layer 112a is formed by a sputtering method or the like. The first electrode layer 112a is provided on the side opposite to the side from which light is extracted and is formed using a reflective material. As the reflective material, a metal material such as aluminum, gold, platinum, silver, nickel, tungsten, chromium, molybdenum, iron, cobalt, copper, or palladium can be used. Alternatively, any of the following may be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked in contact with an aluminum alloy film, whereby oxidation of the aluminum alloy film can be suppressed. As examples of a material of the metal film or the metal oxide film, titanium and titanium oxide are given.

The first electrode layer 112a is provided to be in contact with the first wiring 104.

As the layer 122a containing an organic compound, an EL layer can be used. The EL layer includes at least a light-emitting layer containing a light-emitting organic compound. In addition, the EL layer can have a stacked structure in which a layer containing a substance having a high electron transport property, a layer containing a substance having a high hole transport property, a layer containing a substance having a high electron injection property, a layer containing a substance having a high hole injection property, a layer containing a bipolar substance (a substance having a high electron transport property and a high hole transport property), and the like are combined as appropriate. The EL layer can be formed by an evaporation method (including a vacuum evaporation method), an inkjet method, a coating method, or the like.

As the layer 122a containing an organic compound, a plurality of EL layers may be used. In this case, by forming the layer 122a containing an organic compound using a plurality of EL layers, a tandem light-emitting element can be formed. A stacked-layer structure of two layers, three layers, or four layers (in particular, a stacked-layer structure of three layers) is preferably used. Note that Examples of structures of the EL layer will be described in detail in Embodiment 4.

The second electrode layer 124a is formed by a sputtering method, an evaporation method (including a vacuum evaporation method), an inkjet method, a coating method, or the like. The second electrode layer 124a is formed using a light-transmitting material. For the second electrode layer 124a, indium oxide, indium tin oxide (also referred to as ITO), indium oxide-zinc oxide, zinc oxide, zinc oxide to which gallium is added, graphene, or the like can be used.

In addition, for the second electrode layer 124a, a metal material such as gold, platinum, nickel, tungsten, chromium, molybdenum, iron, cobalt, copper, palladium, or titanium can be used. Alternatively, a nitride of the metal material (such as titanium nitride) or the like may be used. In the case of using the metal material (or the nitride thereof), the second electrode layer 124a may be thinned so as to be able to transmit light. The second electrode layer 124a can be formed to have a single layer or a stacked layer. For example, in the case where the second electrode layer 124a has a three-layer structure, a structure in which an indium tin oxide film, a silver film, an indium tin oxide film are stacked in this order can be used. Alternatively, an alloy of magnesium and silver may be used. In the case of using an alloy of magnesium and silver, an indium tin oxide film with a thickness of 110 nm may be formed over a film of an alloy of magnesium and silver with a thickness of greater than or equal to 0.5 nm and less than or equal to 10 nm, for example. The thickness of the second electrode layer 124a is greater than or equal to 50 nm and less than or equal to 300 nm, preferably greater than or equal to 80 nm and less than or equal to 130 nm, more preferably greater than or equal to 100 nm and less than or equal to 110 nm.

In FIG. 2A, a partition 114a having an insulating property is provided over the first electrode layer 112a, and a partition 114b is provided on an end portion of the first electrode layer 112a. Further, the second electrode layer 124a of the light-emitting element 130(1, 1) and the first electrode layer 112b of the light-emitting element 130(1, 2) are provided to be in contact with each other. Thus, the light-emitting element 130(1, 1) and the light-emitting element 130(1, 2) are connected in series. In FIG. 2B, partitions 114g and 114h are provided on end portions of the first electrode layer 112a.

The partitions 114a, 114b, 114g, and 114h can be formed using an inorganic insulating material and an organic insulating material. The partitions 114a, 114b, 114g, and 114h each have a forward tapered shape. In a forward tapered shape, the width of a side in contact with a surface where an object is formed is larger than the width of the opposite side in a cross section. When the partitions 114a, 114b, 114g, and 114h each have a forward tapered shape, disconnection of a film which is formed thereover can be prevented.

A separation layer 116b is provided in a region where the light-emitting element 130(1, 1) and the light-emitting element 130(1, 2) are adjacent to each other (e.g., over the first electrode layer 112b). A separation layer 116a is provided over the first electrode layer 112a, and a separation layer 116d is provided over the second wiring 108. The separation layers 116a, 116b, and 116d each have an inverse tapered shape. In an inverse tapered shape, the width of a side in contact with a surface where an object is formed is smaller than the width of the opposite side in a cross section. By utilizing the separation layers 116a and 116b each having an inverse tapered shape, the layer 122a containing an organic compound and the layer 122b containing an organic compound can be formed individually. In addition, the second electrode layer 124a is formed by utilizing a property of being able to be formed to extend beyond an end portion of the layer 122a containing an organic compound, so that the second electrode layer 124a and the first electrode layer 112b can be provided to be in contact with each other. Thus, the light-emitting element 130(1, 1) and the light-emitting element 130(1, 2) can be connected to each other. Similarly, a second electrode layer 124c and the second wiring 108 can be provided to be in contact with each other. Thus, the light-emitting element 130(1, 3) and the second wiring 108 can be connected to each other. Note that the separation layers 116a, 116b, and 116d may each have a T shape. The thickness of each of the separation layers 116a, 116b, and 116d is greater than or equal to 1 μm and less than or equal to 3 μm.

The light-emitting element 130(3, 2) and the light-emitting element 130(3, 3) also have a similar structure.

An insulating film 126 serves as a sealing film. The insulating film 126 is formed by a sputtering method, a CVD method, or the like. The insulating film 126 is preferably formed using an inorganic insulating material having a light-transmitting property and a barrier property. For example, a silicon nitride film, an aluminum oxide film, a silicon oxide film, or the like may be used. The insulating film 126 is formed to have a single layer or a stacked layer, and the thickness thereof is greater than or equal to 100 nm and less than or equal to 500 nm. Further, by providing the insulating film 126 which covers a top surface of the light-emitting element, a light-emitting device having high reliability can be provided.

In the light-emitting device according to one embodiment of the present invention, the distance between the light-emitting elements can be reduced by using the separation layers each having an inverse tapered shape; therefore, the degree of integration of the light-emitting element units can be increased. In addition, since the light-emitting device according to one embodiment of the present invention can be manufactured without use of a metal mask for forming a light-emitting element, defects in patterning caused by bending or warping of a metal mask for forming a light-emitting element can be suppressed. Therefore, with the use of the light-emitting device as a lighting device, the lighting device can be provided in which the light-emitting area with respect to a substrate is large and defects in patterning are suppressed.

Embodiment 2

In this embodiment, a method for manufacturing a lighting device according to one embodiment of the present invention is described with reference to FIGS. 3A to 3C, FIGS. 4A and 4B, and FIGS. 5A to 5C. Note that the manufacturing method illustrated in FIGS. 3A to 3C, FIGS. 4A and 4B, and FIGS. 5A to 5C is steps in the cross section taken along line A1-A2 in FIG. 1.

First, the insulating film 102 is formed as a base film over the substrate 100. For the substrate 100 and the insulating film 102, description in Embodiment 1 can be referred to. In this embodiment, a stainless steel substrate is used as the substrate 100. As the insulating film 102, a silicon oxynitride film having a thickness of 100 nm is formed by a CVD method.

Next, the first wiring 104 is formed over the insulating film 102. In this embodiment, as the first wiring 104, a film containing silver with a thickness of 20 μm is formed using a silver paste by a printing method (see FIG. 3A).

Next, the insulating film 106 is formed as a planarization film which covers the first wiring 104. In this embodiment, an epoxy resin with a thickness of 10 μm is used as the insulating film 106. The insulating film 106 may be formed in such a manner that an epoxy resin is formed over the first wiring 104 by a printing method and baked at 230° C. in a clean oven. After that, a photolithography step and an etching step are performed, so that part of the first wiring 104 is exposed.

Next, the second wiring 108 is formed over the insulating film 106. In this embodiment, as the second wiring 108, a film containing silver with a thickness of 20 μm is formed using a silver paste by a printing method (see FIG. 3B).

Next, a mask is formed in the region where the second wiring 108 is formed, and a conductive film is formed over the insulating film 106. Here, as the conductive film, a titanium film, an aluminum film, and a titanium film are stacked in this order by a sputtering method. The thicknesses thereof are 50 nm, 200 nm, and 3 nm. Then, a photolithography step and an etching step are performed, so that the first electrode layer 112a, the first electrode layer 112b, and a first electrode layer 112c are formed. Note that after the first electrode layers 112a, 112b, and 112c are formed, the mask is removed. In addition, the first wiring 104 and the first electrode layer 112a are in contact with each other.

In this embodiment, the case where the second wiring 108 and the first electrode layers 112a, 112b, and 112c are formed in different steps is described; however, one embodiment of the present invention is not limited thereto. For example, the second wiring 108 and the first electrode layers 112a, 112b, and 112c may be formed in the same step. In particular, after the insulating film 106 is formed, a conductive film is formed by a sputtering method and a photolithography step and an etching step are performed, whereby the second wiring 108 and the first electrode layers 112a, 112b, and 112c are formed. In this case, the manufacturing process of the light-emitting device can be simplified.

Next, an insulating film is formed over the first electrode layers 112a to 112c. Here, as the insulating film, a polyimide film with a thickness of 1500 nm is formed by a coating method. The polyimide film may be formed in such a manner that the substrate is coated with polyimide and baked at 320° C. in a clean oven. After that, a photolithography step is performed, so that the partition 114a, the partition 114b, a partition 114c, a partition 114d, a partition 114e, and a partition 114f are formed (see FIG. 3C).

The partition 114b covers an end portion of the first electrode layer 112a and an end portion of the first electrode layer 112b, the partition 114d covers an end portion of the first electrode layer 112b and an end portion of the first electrode layer 112c, and the partition 114f covers an end portion of the first electrode layer 112c. In addition, the partitions 114a, 114c, and 114e are formed over the first electrode layers 112a, 112b, and 112c, respectively.

Next, the separation layers 116a to 116c each having an inverse tapered shape are formed over the first electrode layers 112a to 112c, and the separation layer 116d having an inverse tapered shape is formed over the second wiring 108 (see FIG. 4A). The separation layers 116a to 116d each having an inverse tapered shape can be formed in a photolithography step. For the separation layers 116a to 116d, a negative-type photosensitive resin whose solubility to a developer decreases by light-exposure is used. The photosensitive resin is exposed and developed to form the separation layers 116a to 116d. A taper angle of each of the separation layers 116a to 116d (an angle between a side in contact with a surface where the separation layer is formed and a sidewall of the separation layer) θ is preferably greater than or equal to 100° and less than or equal to 130°. In addition, the thickness of each of the separation layers 116a to 116d is 2 μm.

Next, the layers 122a to 122c containing an organic compound are formed. The layers 122a to 122c containing an organic compound can be formed by an evaporation method. At this time, the distance between the evaporation source and the substrate is set as appropriate. In this embodiment, in order to prevent the layer containing an organic compound from entering the vicinities of lower portions of the separation layers 116a to 116d, the distance between the evaporation source and the substrate is preferably large. Thus, the layers 122a to 122c containing an organic compound can be physically separated by the separation layers 116a to 116d.

Next, the second electrode layers 124a to 124c are formed. The second electrode layers 124a to 124c preferably have a light-transmitting property. Here, as the second electrode layers 124a to 124c, an indium tin oxide film with a thickness of 100 nm is formed by a sputtering method. In this embodiment, the distance between the target and the substrate is preferably short so that the second electrode layers 124a to 124c extend beyond end portions of the separation layers 116a to 116d and enter the vicinities of the lower portions of the separation layers 116a to 116d. Thus, as compared to the layers 122a to 122c containing an organic compound, the second electrode layers 124a to 124c can be formed so as to enter the vicinities of the lower portions of the separation layers 116a to 116d. When the taper angle of each of the separation layers 116a to 116d (an angle between a side in contact with a surface where the separation layer is formed and a sidewall of the separation layer) θ is greater than or equal to 100° and less than or equal to 130°, the second electrode layers 124a, 124b, and 124c are formed to be in contact with the first electrode layer 112b, the first electrode layer 112c, and the second wiring 108, respectively. As a result, the second electrode layer 124a and the first electrode layer 112b are connected to each other, the second electrode layer 124b and the first electrode layer 112c are connected to each other, and the second electrode layer 124c and the second wiring 108 are connected to each other.

Figure 4B:
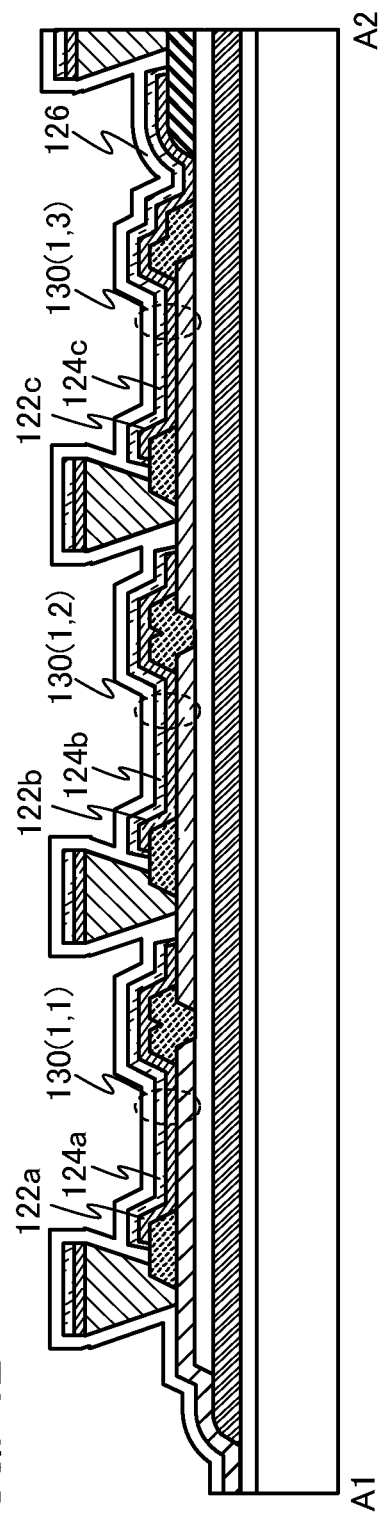

Through the above steps, the light-emitting elements 130(1, 1) to 130(1, 3) connected in series can be formed over the substrate (see FIG. 4B). In the light-emitting element unit 200 illustrated in FIG. 1 and FIGS. 2A and 2B, the light-emitting element rows are separated by the separation layers. Thus, the light-emitting element unit 200 in which the light-emitting element rows are connected in parallel can be manufactured. Each distance between the light-emitting elements can be determined by the widths of the separation layers. Therefore, when the widths of the separation layers are set small, the degree of integration of the light-emitting elements can be increased.

Next, the insulating film 126 is formed so as to cover the light-emitting element unit 200 formed over the substrate 100. As the insulating film 126, an aluminum oxide film is formed by a sputtering method. With the use of an aluminum oxide film as the insulating film 126, the entry of an impurity or moisture to the light-emitting element can be prevented. Accordingly, deterioration of the light-emitting element can be suppressed.

In this embodiment, the case where the separation layers 116a to 116d are formed using a negative-type photosensitive resin is described; however, they can be formed using two kinds of photosensitive resins. A method for forming the separation layers using two kinds of photosensitive resins is described with reference to FIGS. 5A to 5C.

First, after the partitions 114a to 114f are formed in accordance with the steps described in FIGS. 3A to 3C, an insulating film 117 and an insulating film 118 are formed in this order (see FIG. 5A). In this embodiment, for the insulating film 117, a material with lower photosensitivity to light used for light exposure than that of the insulating film 118 is used. The difference in these photosensitivities means that the diameter of a pattern of the insulating film 117 with a low photosensitivity becomes smaller than that of the insulating film 118 when the insulating films 117 and 118 are irradiated with light with the same intensity.

Next, the insulating films 117 and 118 are selectively irradiated with light. After that, development treatment is performed, so that separation layers 119a to 119d including insulators formed using the insulating film 117 (leg portions 117a to 117d) and insulators formed using the insulating film 118 (stage portions 118a to 118d) can be formed (see FIG. 5B). When the insulating films 117 and 118 are selectively irradiated with light, the separation layers 119a to 119d each have the following shape: an area in which the leg portions 117a to 117d are in contact with a surface where the leg portions 117a to 117d are formed is smaller than an area in which the stage portions 118a to 118d are projected because of the difference in the photosensitivities.

After that, the layers 122a to 122c containing an organic compound and the second electrode layers 124a to 124c are formed, and then the insulating film 126 is formed, so that the light-emitting elements 130(1, 1) to 130(1, 3) can be formed (see FIG. 5C).

As described above, in the light-emitting device according to one embodiment of the present invention, the distance between the light-emitting elements can be reduced by using the separation layers each having an inverse tapered shape; therefore, the degree of integration of the light-emitting element units can be increased. In addition, since the light-emitting device according to one embodiment of the present invention can be manufactured without use of a metal mask for forming a light-emitting element, defects in patterning caused by bending or warping of a metal mask for forming a light-emitting element can be suppressed. In addition, a particle attached on a metal mask is not transferred from a metal mask to a substrate; therefore, yield in manufacture can be increased and the manufacturing cost can be reduced.

Embodiment 3

In this embodiment, a lighting device in which the light-emitting device described in the above embodiment is described with reference to FIG. 6.

Figure 6:
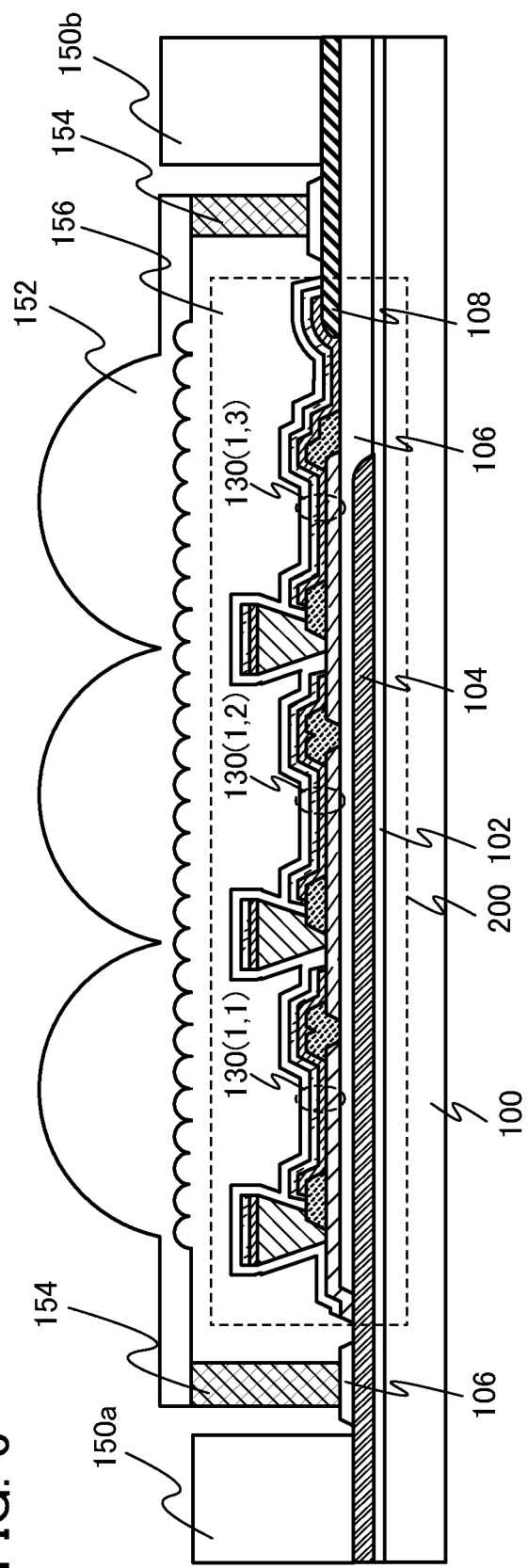
FIG. 6 is a cross-sectional view illustrating a lighting device according to one embodiment of the present invention.

FIG. 6 is a cross-sectional view of a lighting device according to one embodiment of the present invention. As a light source of the lighting device, a light-emitting device including the light-emitting element unit 200 can be used.

The first wiring 104 is provided over the substrate 100 with the insulating film 102 provided therebetween, and the second wiring 108 and the light-emitting element unit 200 are provided over the first wiring 104 with the insulating film 106 provided therebetween. The substrate 100 and an optical element 152 are bonded to each other with a sealant 154. A space surrounded by the substrate 100, the optical element 152, and the sealant 154 is filled with a high refractive resin 156. In the substrate 100, converters 150a and 150b are provided on the outer side of the region surrounded by the sealant 154.

The structure described in the above embodiment can be used for the light-emitting element unit 200. In addition, the light-emitting element unit 200 is connected to the converter 150a through the first wiring 104 and connected to the converter 150b through the second wiring 108.

For the converters 150a and 150b, for example, an AC-DC converter which converts a voltage output from an alternating-current power source for home use into a direct voltage, a DC-DC converter, or the like, can be used. Different voltages are output to the first wiring 104 and the second wiring 108, which are respectively connected to the converters 150a and 150b. Current flows to the light-emitting element unit 200 by this voltage difference between the first wiring 104 and the second wiring 108, so that the light-emitting element unit 200 emits light.

When a plurality of light-emitting element units are provided in parallel, the number of the light-emitting element units may be set as appropriate depending on the output characteristics of the converters 150a and 150b. The number of the light-emitting element units connected in parallel can increase as the amount of current that flows from the converters 150a and 150b increases.

A known material can be used as the sealant 154. For example, a thermosetting material or a UV curable material may be used. A material capable of bonding the substrate 100 and the optical element 152 is used as the sealant 154. Further, it is desirable that the sealant 154 is a material which does not transmit moisture or oxygen as much as possible. In addition, a sealant containing a desiccating agent can be used.

In the case where light emitted from the light-emitting element unit is extracted from a top surface, the space surrounded by the substrate 100, the optical element 152, and the sealant 154 is preferably filled with the high refractive resin 156 in order to improve the light extraction efficiency.

In addition, it is preferable that the refraction index of the high refractive resin 156 be lower than that of the light-emitting region of the light-emitting element unit and higher than that of the optical element 152. Thus, light emitted from the light-emitting element unit 200 can be preferably extracted. Note that in the case where the high refractive resin 156 has a bonding function, the substrate 100 and the optical element 152 can be bonded to each other with the high refractive resin 156; therefore, the sealant 154 is not necessarily used.

For the optical element 152, a hemispherical lens, a micro lens array, a film provided with an uneven structure, a light diffusing film, or the like can be used. In this embodiment, an optical element is used in which a plurality of projections are formed on one surface and a plurality of depressions are formed on the other surface. At this time, it is preferable that the projection formed on the one surface be larger than the light-emitting region of the light-emitting element. Further, it is preferable that the depression formed on the other surface be smaller than the light-emitting region of the light-emitting element. Thus, total reflection at a boundary surface between the high refractive resin 156 and the optical element 152 can be suppressed; therefore, light emitted from the light-emitting element unit 200 can be preferably extracted to the outside.

With the structure described in this embodiment, the lighting device in which the light extraction efficiency of the light-emitting element unit is increased can be provided.

Embodiment 4

In this embodiment, an example of an element structure of a light-emitting element exhibiting organic EL emission, which is used in a light-emitting device according to one embodiment of the present invention, will be described. The light-emitting element exhibiting organic EL emission generates a smaller amount of heat than an LED. Thus, an organic resin can be used for a housing, so that a reduction in weight of the light-emitting device is possible, which is preferable.

The light-emitting element illustrated in FIG. 7A includes a first electrode layer 304, an EL layer 306 over the first electrode layer 304, and a second electrode layer 308 over the EL layer 306. The first electrode layer 304 corresponds to the first electrode layers 112a to 112c described in the above embodiments, and the EL layer 306 corresponds to the layers 122a to 122c containing an organic compound described in the above embodiments. The second electrode layer 308 corresponds to the second electrode layers 124a to 124c described in the above embodiments.

The EL layer 306 includes at least a light-emitting layer containing a light-emitting organic compound. In addition, the EL layer 306 can have a stacked structure in which a layer containing a substance having a high electron transport property, a layer containing a substance having a high hole transport property, a layer containing a substance having a high electron injection property, a layer containing a substance having a high hole injection property, a layer containing a bipolar substance (a substance having a high electron transport property and a high hole transport property), and the like are combined as appropriate. In this embodiment, a hole injection layer 701, a hole transport layer 702, a light-emitting layer 703, an electron transport layer 704, and an electron injection layer 705 are stacked in this order from the first electrode layer 304 side in the EL layer 306.

A method for manufacturing the light-emitting element illustrated in FIG. 7A will be described.

First, the first electrode layer 304 is formed. The first electrode layer 304 is provided on the side opposite to the side from which light is extracted and is formed using a reflective material. As the reflective material, a metal material such as aluminum, gold, platinum, silver, nickel, tungsten, chromium, molybdenum, iron, cobalt, copper, or palladium can be used. Further, any of the following may be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked in contact with an aluminum alloy film, whereby oxidation of the aluminum alloy film can be suppressed. As examples of a material of the metal film or the metal oxide film, titanium and titanium oxide are given. The above materials are preferable because they are present in large amounts in the Earth's crust and inexpensive and thus a reduction in manufacturing cost of a light-emitting element can be achieved.

Next, the EL layer 306 is formed over the first electrode layer 304. In this embodiment, the EL layer 306 includes the hole injection layer 701, the hole transport layer 702, the light-emitting layer 703, the electron transport layer 704, and the electron injection layer 705.

The electron injection layer 705 is a layer containing a substance having a high electron injection property. For the electron injection layer 705, an alkali metal, an alkaline earth metal, or a compound thereof, such as lithium, cesium, calcium, lithium fluoride, cesium fluoride, calcium fluoride, or lithium oxide, can be used. Further, a rare earth metal compound such as erbium fluoride may be used. A substance for forming the electron transport layer 704 may be used.

The electron transport layer 704 is a layer containing a substance having a high electron transport property. As the substance having a high electron transport property, any of the following can be used, for example: a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), can be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like may be used. The substances mentioned here are mainly ones that have an electron mobility of $10^{-6}$ cm$^2$/V·s or higher. The electron transport layer is not necessarily a single layer and may be formed of a stack including two or more layers containing any of the above substances.

The light-emitting layer 703 is a layer containing a light-emitting organic compound. As the light-emitting organic compound, for example, a fluorescent compound which exhibits fluorescence or a phosphorescent compound which exhibits phosphorescence can be used. The use of phosphorescent compounds for emission of all of red (R) light, green (G) light, and blue (B) light makes it possible to obtain high luminous efficiency.

The fluorescent compounds that can be used for the light-emitting layer 703 will be given. Examples of a material for blue light emission include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA). Further, examples of a material for green light emission include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of a material for yellow light emission include rubrene and 5,12-bis(1,1'-biphenyl-4-yl)-6,11-diphenyltetracene (abbreviation: BPT). Examples of a material for red light emission include N,N,N',N'-tetrakis(4-methylphenyl)tetracene-5,11-diamine (abbreviation: p-mPhTD), and 7,14-diphenyl-N,N,N',N'-tetrakis(4-methylphenyl)acenaphtho[1,2-α]fluoranthene-3,10-diamine (abbreviation: p-mPhAFD).

The phosphorescent compounds that can be used for the light-emitting layer 703 will be given. Examples of a material for blue light emission include bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: Ir(CF$_3$ppy)$_2$(pic)), and bis[2-(4',6'-difluorophenyl)pyridinato-N,$C^{2'}$]iridium(III) acetylacetonate (abbreviation: FIr(acac)). Examples of a material for green light emission include tris(2-phenylpyridinato-N,$C^{2'}$)iridium(III) (abbreviation: Ir(ppy)$_3$), bis(2-phenylpyridinato-N,$C^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$). Examples of a material for yellow light emission include bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)). Examples of a material for orange light emission include tris(2-phenylquinolinato-N,$C^{2'}$)iridium(III) (abbreviation: Ir(pq)$_3$), bis(2-phenylquinolinato-N,$C^{2'}$)iridium(III) acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)). Examples of a material for red light emission include organometallic complexes such as bis[2-(2'-benzo[4,5-α]thienyl)pyridinato-N,$C^{3'}$]iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and 2,3,7,8,12,13,17,18-octaethyl-21H,23H-porphyrinplatinum(II) (abbreviation: PtOEP). Further, rare-earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the light-emitting layer 703 may have a structure in which the above light-emitting organic compound (a guest material) is dispersed in another substance (a host material). As a host material, a variety of kinds of materials can be used, and it is preferable to use a substance which has a lowest unoccupied molecular orbital level (LUMO level) higher than that of the light-emitting substance and has a highest occupied molecular orbital level (HOMO level) lower than that of the light-emitting substance.

Specific examples of the host material include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), and 6,12-dimethoxy-5,11-diphenylchrysene; and aromatic amine compounds such as N,N-dipheyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB.

As the host material, plural kinds of materials can be used. For example, in order to suppress crystallization, a substance such as rubrene which suppresses crystallization may be further added. In addition, NPB, Alq, or the like may be further added in order to efficiently transfer energy to a guest material.

When a structure in which a guest material is dispersed in a host material is employed, crystallization of the light-emitting layer 703 can be suppressed. Further, concentration quenching due to high concentration of the guest material can be suppressed.

For the light-emitting layer 703, a high molecular compound can be used. Specifically, a material for blue light emission, a material for green light emission, and a material for orange to red light emission are given. Examples of a material for blue light emission include poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), and poly{(9,9-dioctylfluorene-2,7-diyl)-co-[N,N'-di-(p-butylphenyl)-1,4-diaminobenzene]} (abbreviation: TAB-PFH). Examples of a material for green light emission include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenfluorenylene)-alt-co-(2-methoxy-5-(2-ethylhexyloxy)-1,4-phenylene)]. Examples of a material for orange to red light emission include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD).

Note that the light-emitting layer may have a stacked structure of two or more layers. When the light-emitting layer has a stacked structure of two or more layers and the kinds of light-emitting substances for light-emitting layers vary, a variety of emission colors can be obtained. In addition, a plurality of light-emitting substances of different colors are used as the light-emitting substances, whereby light emission having a broad spectrum or white light emission can also be obtained. In particular, for a lighting device in which high luminance is required, a structure in which light-emitting layers are stacked is preferable.

The hole transport layer 702 is a layer containing a substance having a high hole transport property. As the substance having a high hole transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones that have a hole mobility of $10^{-6}$ cm$^2$/Vs or higher. Note that any other substance may be used as long as the hole transport property thereof is higher than the electron transport property thereof. Note that the layer containing a substance having a high hole transport property is not limited to a single layer and may be formed of a stack of two or more layers containing any of the above substances.

For the hole transport layer 702, a carbazole derivative such as CBP, CzPA, or PCzPA or an anthracene derivative such as t-BuDNA, DNA, or DPAnth may be used.

For the hole transport layer 702, a high molecular compound such as PVK, PVTPA, PTPDMA, or Poly-TPD may be used.

The hole injection layer 701 is a layer containing a substance having a high hole injection property. As the substance having a high hole injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: H$_2$Pc) or copper(II) phthalocyanine (abbreviation: CuPc) may be used.

Further, any of the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Furthermore, any of high molecular compounds (e.g., oligomers, dendrimers, or polymers) may be used. Examples of the high molecular compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), may be used.

In particular, for the hole injection layer 701, a composite material in which an organic compound having a high hole transport property is mixed with an acceptor substance is preferably used. With the use of the composite material in which a substance having a high hole transport property is mixed with an acceptor substance, excellent hole injection from the second electrode layer 308 can be obtained, which results in a reduction in driving voltage of the light-emitting element. Such a composite material can be formed by co-evaporation of a substance having a high hole transport property and an acceptor substance. The hole injection layer 701 is formed using the composite material, whereby hole injection from the second electrode layer 308 to the EL layer 306 is facilitated.

As the organic compound for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole transport property. Specifically, a substance having a hole mobility of $10^{-6}$ cm$^2$/Vs or higher is preferably used. Note that any other substance may be used as long as the hole transport property thereof is higher than the electron transport property thereof. Specific examples of the organic compound that can be used for the composite material are given below.

Examples of the organic compound that can be used for the composite material include aromatic amine compounds such as TDATA, MTDATA, DPAB, DNTPD, DPA3B, PCzPCA1, PCzPCA2, PCzPCN1,4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Further, any of the following aromatic hydrocarbon compounds may be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, and the like.

Furthermore, any of the following aromatic hydrocarbon compounds may be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Examples of the electron acceptor include organic compounds such as 7,7,8,8-tetracyano-2,3,5,6-tetrafluoroquinodimethane (abbreviation: F$_4$-TCNQ) and chloranil; and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron accepting property. Among these, molybdenum oxide is particularly preferable because it is stable in the air, has a low hygroscopic property, and is easily handled.

The composite material may be formed using the above electron acceptor and the above high molecular compound such as PVK, PVTPA, PTPDMA, or Poly-TPD and used for the hole injection layer 701.

Note that the electron injection layer 705, the electron transport layer 704, the light-emitting layer 703, the hole transport layer 702, and the hole injection layer 701 which are described above can each be formed by an evaporation method (e.g., a vacuum evaporation method), an inkjet method, a coating method, or the like.

Note that a plurality of EL layers may be stacked between the first electrode layer 304 and the second electrode layer 308 as illustrated in FIGS. 7B1 and 7B2. FIG. 7B1 illustrates an example including two EL layers, in which a first EL layer 800 and a second EL layer 801 are provided between the first electrode layer 304 and the second electrode layer 308, with a charge generation layer 803 laid between the first EL layer 800 and the second EL layer 801. FIG. 7B2 illustrates an example including three EL layers, in which the first EL layer 800, the second EL layer 801, and a third EL layer 802 are provided between the first electrode layer 304 and the second electrode layer 308, with charge generation layers 803a and 803b laid between the first EL layer 800 and the second EL layer 801 and between the second EL layer 801 and the third EL layer 802, respectively.

When the EL layers are stacked, the charge generation layer (the charge generation layer 803, 803a, or 803b) is preferably provided between the stacked EL layers (between the first EL layer 800 and the second EL layer 801 or between the second EL layer 801 and the third EL layer 802). The charge generation layers 803, 803a, and 803b can each be formed using the above composite material. Further, the charge generation layers 803, 803a, and 803b may each have a stacked structure including a layer containing the composite material and a layer containing another material. In that case, as the layer containing another material, a layer containing an electron donating substance and a substance having a high electron transport property, a layer formed of a transparent conductive film, or the like can be used. As for a light-emitting element having such a structure, problems such as energy transfer and quenching are less likely to occur, and thus a light-emitting element which has both high luminous efficiency and long lifetime can be easily obtained due to expansion in the choice of materials. Moreover, a light-emitting element which provides phosphorescence from one of the EL layers and fluorescence from the other can be readily obtained. Note that this structure can be combined with any of the above structures of the EL layer.

When the charge generation layer is provided between the stacked EL layers as illustrated in FIGS. 7B1 and 7B2, the element can have high luminance and a long lifetime while the current density is kept low. In addition, a voltage drop due to resistance of an electrode material can be reduced, whereby uniform light emission in a large area is possible.

In the case of a stack-type element having a structure in which two EL layers are stacked, white light emission can be extracted to the outside by allowing a first EL layer and a second EL layer to emit light of complementary colors. White light emission can also be obtained with a structure including a plurality of light-emitting layers in which light emission color of a first EL layer and light emission color of a second EL layer are colors complementary to each other. As complementary relations blue and yellow, blue-green and red, and the like can be given. A substance which emits blue light, yellow light, blue-green light, or red light may be selected as appropriate from, for example, the light-emitting substances given above.

An example of a light-emitting element having a structure in which a plurality of EL layers are stacked will be described below. First, an example of a structure in which each of the first EL layer and the second EL layer includes a plurality of light-emitting layers which emit light of complementary colors will be described. With this structure, white light emission can be obtained.

For example, the first EL layer includes a first light-emitting layer which has an emission spectrum with a peak in the wavelength range of blue to blue-green, and a second light-emitting layer which has an emission spectrum with a peak in the wavelength range of yellow to orange. The second EL layer includes a third light-emitting layer which has an emission spectrum with a peak in the wavelength range of blue-green to green, and a fourth light-emitting layer which has an emission spectrum with a peak in the wavelength range of orange to red.

In this case, light emission from the first EL layer is a combination of light emission from both the first light-emitting layer and the second light-emitting layer and thus exhibits an emission spectrum having both a peak in the wavelength range of blue to blue-green and a peak in the wavelength range of yellow to orange. That is, the first EL layer emits light of two-wavelength type white color or a two-wavelength type color close to white.

In addition, light emission from the second EL layer is a combination of light emission from both the third light-emitting layer and the fourth light-emitting layer and thus exhibits an emission spectrum having both a peak in the wavelength range of blue-green to green and a peak in the wavelength range of orange to red. That is, the second EL layer emits light of two-wavelength type white color or a two-wavelength type color close to white, which is different from that of the first EL layer.

Accordingly, by combining the light emission from the first EL layer and the light emission from the second EL layer, white light emission which covers the wavelength range of blue to blue-green, the wavelength range of blue-green to green, the wavelength range of yellow to orange, and the wavelength range of orange to red can be obtained.

Further, the wavelength range of yellow to orange (greater than or equal to 560 nm and less than 580 nm) is a wavelength range of high spectral luminous efficacy; thus, application of an EL layer which includes a light-emitting layer having an emission spectrum peak in the wavelength range of yellow to orange is useful. For example, a structure can be used in which a first EL layer which includes a light-emitting layer having an emission spectrum peak in a blue wavelength range, a second EL layer which includes a light-emitting layer having an emission spectrum peak in an yellow wavelength range, and a third EL layer which includes a light-emitting layer having an emission spectrum peak in a red wavelength range are stacked.

Further, two or more EL layers exhibiting yellow to orange color may be stacked. The power efficiency can be further improved by stacking two or more EL layers exhibiting yellow to orange color.

For example, in the case of a light-emitting element in which three EL layers are stacked as in FIG. 7B2, a second EL layer and a third EL layer each of which includes a light-emitting layer having an emission spectrum peak in the wavelength range of yellow to orange may be stacked over a first EL layer which includes a light-emitting layer having an emission spectrum peak in a blue wavelength range (greater than or equal to 400 nm and less than 480 nm). Note that the wavelengths of the peaks of the spectra of light emitted from the second EL layer and the third EL layer may be the same or different from each other.

When the number of EL layers which are stacked is increased, the power efficiency of a light-emitting element can be improved; however, there occurs a problem that the manufacturing process becomes complicated. Thus, the structure in which three EL layers are stacked as in FIG. 7B2 is preferable because the power efficiency is high as compared to the case of a structure of two EL layers and the manufacturing process is simple as compared to the case of a structure of four or more EL layers.

The use of the EL layer which has an emission spectrum peak in the yellow to orange wavelength range makes it possible to utilize the wavelength range of high spectral luminous efficacy, allowing improvement in power efficiency. Accordingly, the power efficiency of the whole light-emitting element can be improved. Such a structure is advantageous in terms of spectral luminous efficacy and thus enables improvement in power efficiency as compared to the case where, for example, an EL layer which emits green light and an EL layer which emits red light are stacked to obtain a light-emitting element which emits yellow to orange light. Further, the emission intensity of light of the blue wavelength range of low spectral luminous efficacy is relatively low as compared to the case of using one EL layer which has an emission spectrum peak in the yellow to orange wavelength range of high spectral luminous efficacy; thus, the color of emitted light is close to incandescent color (or warm white), and the power efficiency is improved.

In other words, in the above light-emitting element, the color of light which is obtained by combining light whose emission spectrum peak is in the yellow to orange wavelength range and whose wavelength of the peak is greater than or equal to 560 nm and less than 580 nm and light whose emission spectrum peak is in the blue wavelength range (i.e., the color of light emitted from the light-emitting element) can be natural color like warm white or incandescent color. In particular, incandescent color can be easily achieved.

As a light-emitting substance which emits light having a peak in the yellow to orange wavelength range, for example, an organometallic complex in which a pyrazine derivative functions as a ligand can be used. Alternatively, the light-emitting layer may be formed by dispersing a light-emitting substance (a guest material) in another substance (a host material). A phosphorescent compound can be used as the light-emitting substance which emits light having a peak in the yellow to orange wavelength range. The power efficiency in the case of using a phosphorescent compound is three to four times as high as that in the case of using a fluorescent compound. The above organometallic complex in which a pyrazine derivative functions as a ligand is a phosphorescent compound, has high emission efficiency, and easily emits light in the yellow to orange wavelength range, and thus is favorable.

As a light-emitting substance which emits light having a peak in the blue wavelength range, for example, a pyrene diamine derivative can be used. A fluorescent compound can be used as the light-emitting substance which emits light having a peak in the blue wavelength range. The use of a fluorescent compound makes it possible to obtain a light-emitting element which has a longer lifetime than a light-emitting element in which a phosphorescent compound is used. The above pyrene diamine derivative is a fluorescent compound, can obtain an extremely high quantum yield, and has a long lifetime; thus, the above pyrene diamine derivative is favorable.

As illustrated in FIG. 7C, the EL layer may include a composite material layer 708, an electron relay layer 707, an electron injection buffer layer 706, the electron transport layer 704, the light-emitting layer 703, the hole transport layer 702, and the hole injection layer 701, between the first electrode layer 304 and the second electrode layer 308.

The composite material layer 708 can be formed using the above composite material in which an organic compound having a high hole transport property is mixed with an acceptor substance.

Further, by providing the electron injection buffer layer 706, an injection barrier between the composite material layer 708 and the electron transport layer 704 can be reduced; thus, electrons generated in the composite material layer 708 can be easily injected to the electron transport layer 704.

Any of the following substances having a high electron injection property can be used for the electron injection buffer layer 706: an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), a rare earth metal compound (e.g., an oxide, a halide, and a carbonate)), and the like.

Further, in the case where the electron injection buffer layer 706 contains a substance having a high electron transport property and a donor substance, the donor substance is preferably added so that the mass ratio of the donor substance to the substance having a high electron transport property is from 0.001:1 to 0.1:1. Note that as the donor substance, an organic compound such as tetrathianaphthacene (abbreviation: TTN), nickelocene, or decamethylnickelocene may be used as well as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate)). Note that as the substance having a high electron transport property, a material similar to the material for the electron transport layer 704 described above can be used.

Furthermore, the electron relay layer 707 is preferably formed between the electron injection buffer layer 706 and the composite material layer 708. The electron relay layer 707 is not necessarily provided; however, by providing the electron relay layer 707 having a high electron transport property, electrons can be rapidly transported to the electron injection buffer layer 706.

The structure in which the electron relay layer 707 is sandwiched between the composite material layer 708 and the electron injection buffer layer 706 is a structure in which the acceptor substance contained in the composite material layer 708 and the donor substance contained in the electron injection buffer layer 706 are less likely to interact with each other, and thus their functions hardly interfere with each other. Accordingly, an increase in driving voltage can be prevented.

The electron relay layer 707 contains a substance having a high electron transport property and is formed so that the LUMO level of the substance having a high electron transport property is located between the LUMO level of the acceptor substance contained in the composite material layer 708 and the LUMO level of the substance having a high electron transport property contained in the electron transport layer 704. In the case where the electron relay layer 707 contains a donor substance, the donor level of the donor substance is controlled so as to be located between the LUMO level of the acceptor substance in the composite material layer 708 and the LUMO level of the substance having a high electron transport property contained in the electron transport layer 704. As a specific value of the energy level, the LUMO level of the substance having a high electron transport property contained in the electron relay layer 707 is preferably greater than or equal to −5.0 eV, more preferably greater than or equal to −5.0 keV and less than or equal to −3.0 eV.

As the substance having a high electron transport property contained in the electron relay layer 707, a phthalocyanine-based material or a metal complex having a metal-oxygen bond and an aromatic ligand is preferably used.

As the phthalocyanine-based material contained in the electron relay layer 707, specifically, any of the following is preferably used: CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having a metal-oxygen double bond makes it possible to drive the light-emitting element at low voltage more stably.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based material described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron relay layer 707 may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and compounds of the above metals (e.g., alkali metal compounds (including an oxide such as lithium oxide, a halide, and carbonates such as lithium carbonate and cesium carbonate), alkaline earth metal compounds (including an oxide, a halide, and a carbonate), and rare earth metal compounds (including an oxide, a halide, and a carbonate)). When such a donor substance is contained in the electron relay layer 707, electrons can be transferred easily and the light-emitting element can be driven at lower voltage.

In the case where a donor substance is contained in the electron relay layer 707, other than the materials described above as the substance having a high electron transport property, a substance having a LUMO level greater than the acceptor level of the acceptor substance contained in the composite material layer 708 may be used. As a specific energy level of the substance having a LUMO level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron relay layer 707 because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), and N,N'-dihexyl-3,4,9,10-perylenetetracarboxylic diimide (abbreviation: Hex PTC).

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), and 2,3-bis(4-fluorophenyl)pyrido[2,3-b]pyrazine (abbreviation: F2PYPR).

Other examples are 7,7,8,8-tetracyanoquinodimethane (abbreviation: TCNQ), 1,4,5,8-naphthalenetetracarboxylic-dianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophen (abbreviation: DCMT), and methanofullerene (e.g., [6,6]-phenyl C$_{61}$ butyric acid methyl ester).

Note that in the case where a donor substance is contained in the electron relay layer 707, the electron relay layer 707 may be formed by a method such as co-evaporation of the substance having a high electron transport property and the donor substance.

The hole injection layer 701, the hole transport layer 702, the light-emitting layer 703, and the electron transport layer 704 may each be formed using any of the above materials.

Then, the second electrode layer 308 is formed over the EL layer 306.

The second electrode layer 308 is provided in the direction in which light is extracted from the EL layer and thus is formed using a light-transmitting material.

As the light-transmitting material, indium oxide, ITO, indium oxide-zinc oxide, zinc oxide, zinc oxide to which gallium is added, graphene, or the like can be used.

As the first electrode layer 304, a metal material such as gold, platinum, nickel, tungsten, chromium, molybdenum, iron, cobalt, copper, palladium, or titanium can be used. Alternatively, a nitride of the metal material (such as titanium nitride) or the like may be used.

Note that this embodiment can be freely combined with any of the other embodiments as appropriate.

Embodiment 5

In this embodiment, an example of a lighting device including the light-emitting device of one embodiment of the present invention will be described with reference to FIGS. 8A and 8B.

In this embodiment, a lighting device whose light-emitting portion has a curved surface can be provided.

A lighting device according to one embodiment of the present invention can be used for lighting in a car; for example, lighting can be provided for a dashboard, ceiling, or the like.

Figure 8A:
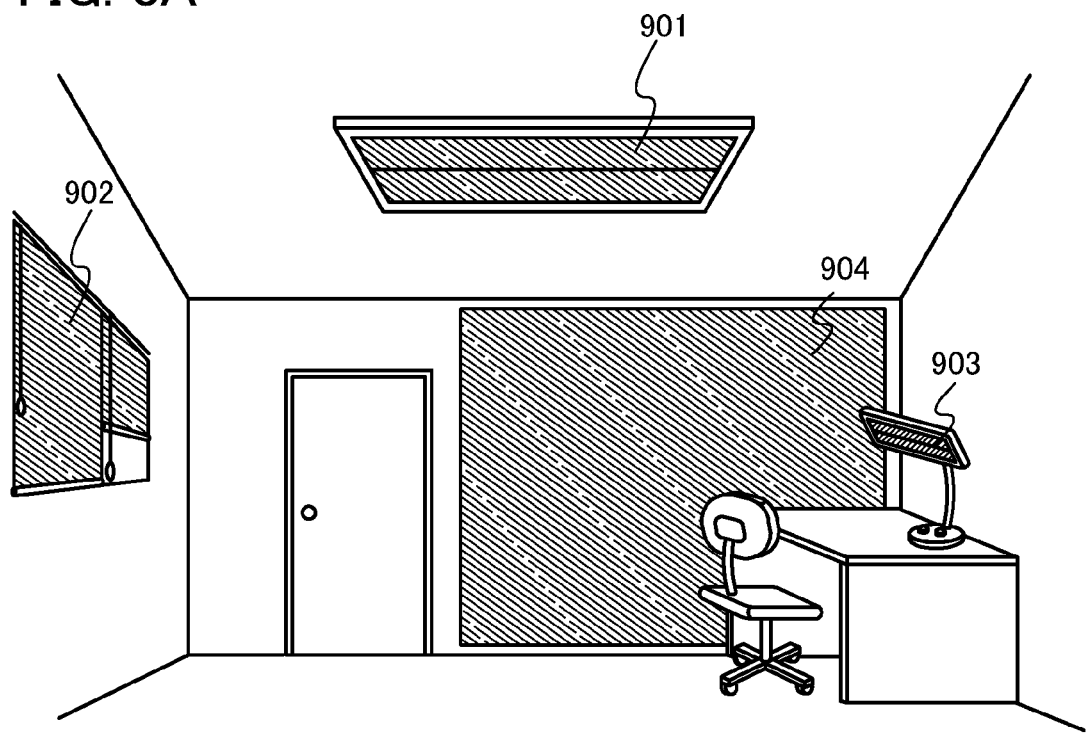
FIGS. 8A and 8B are diagrams illustrating lighting devices according to embodiments of the present invention.

FIG. 8A illustrates an interior lighting device 901, a lighting device 904 provided on a wall surface, and a desk lamp 903 to which the light-emitting device according to one embodiment of the present invention is applied. The area of the light-emitting device according to one embodiment of the present invention can be increased, and therefore can be used as a large-area lighting device. Furthermore, the light-emitting device can be used as a roll-type lighting device 902.

Figure 8B:
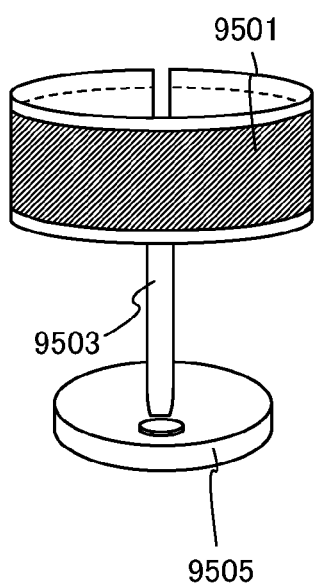

FIG. 8B illustrates another example of the lighting device. A desk lamp illustrated in FIG. 8B includes a lighting portion 9501, a support 9503, a support base 9505, and the like. The lighting portion 9501 includes the light-emitting device according to one embodiment of the present invention. With the use of the light-emitting device according to one embodiment of the present invention as described above, a lighting device having a curved surface or a lighting device having a flexible lighting portion can be provided. The use of a flexible light-emitting device for a lighting device as described above not only improves the degree of freedom in design of the lighting device but also enables the lighting device to be mounted onto a portion having a curved surface, such as the ceiling or a dashboard of a car.

This embodiment can be freely combined with any of the other embodiments.

This application is based on Japanese Patent Application serial no. 2011-028854 filed with Japan Patent Office on Feb. 14, 2011, the entire contents of which are hereby incorporated by reference.

What is claimed is:

1. A light-emitting device comprising:
   a substrate;
   a first wiring over the substrate;
   an insulating film over the first wiring;
   a second wiring over the insulating film; and
   a first light-emitting element, a second light-emitting element, and a third light-emitting element over the insulating film, each of the first to third light-emitting elements comprising:
      a first electrode having a light-blocking property;
      a layer containing an organic compound on the first electrode; and
      a second electrode having a light-transmitting property on the layer containing an organic compound,
   wherein the layers containing an organic compound of the first and second light-emitting elements are separated from each other by a separation layer,
   wherein the second electrodes of the first and second light-emitting elements are separated from each other by the separation layer,
   wherein the first electrode of the first light-emitting element is directly in contact with the first wiring,
   wherein the second electrode of the first light-emitting element extends beyond an edge portion of the layer containing an organic compound of the first light-emitting element and is directly in contact with the first electrode of the second light-emitting element,
   wherein the second electrode of the third light-emitting element extends beyond an edge portion of the layer containing an organic compound of the third light-emitting element and is directly in contact with the second wiring, and
   wherein the first light-emitting element, the second light-emitting element, and the third light-emitting element are electrically connected to each other in series.

2. The light-emitting device according to claim 1, further comprising a fourth light-emitting element, a fifth light-emitting element, and a sixth light-emitting element over the insulating film,
   wherein the fourth light-emitting element, the fifth light-emitting element, and the sixth light-emitting element are electrically connected to each other in series.

3. The light-emitting device according to claim 2,
   wherein a first light-emitting element row comprising the first light-emitting element, the second light-emitting element, and the third light-emitting element and a second light-emitting element row comprising the fourth light-emitting element, the fifth light-emitting element, and the sixth light-emitting element are electrically connected to each other in parallel.

4. The light-emitting device according to claim 1, wherein a cross section of the separation layer has a shape in which a side in contact with a surface where the separation layer is formed is shorter than the opposite side.

5. The light-emitting device according to claim 1, wherein the substrate is made of organic resin or metal.

6. The light-emitting device according to claim 1, wherein the first wiring and the second wiring are formed of a conductive paste.

7. The light-emitting device according to claim 1, wherein light emitted from the first light-emitting element is extracted through the second electrode of the first light-emitting element.

8. A lighting device comprising the light-emitting device according to claim 1.

9. A light-emitting device comprising:
a substrate;
a first wiring over the substrate;
an insulating film over the first wiring;
a second wiring over the insulating film; and
a first light-emitting element, a second light-emitting element, and a third light-emitting element over the insulating film, each of the first to third light-emitting elements comprising:
a first electrode;
a layer containing an organic compound on the first electrode; and
a second electrode on the layer containing an organic compound,
wherein the layers containing an organic compound of the first and second light-emitting elements are separated from each other by a separation layer,
wherein the second electrodes of the first and second light-emitting elements are separated from each other by the separation layer,
wherein the first electrode of the first light-emitting element is directly in contact with the first wiring,
wherein the second electrode of the first light-emitting element extends beyond an edge portion of the layer containing an organic compound of the first light-emitting element and is directly in contact with the first electrode of the second light-emitting element,
wherein the second electrode of the third light-emitting element extends beyond an edge portion of the layer containing an organic compound of the third light-emitting element and is directly in contact with the second wiring, and
wherein the first light-emitting element, the second light-emitting element, and the third light-emitting element are electrically connected to each other in series.

10. The light-emitting device according to claim 9, further comprising a fourth light-emitting element, a fifth light-emitting element, and a sixth light-emitting element over the insulating film,
wherein the fourth light-emitting element, the fifth light-emitting element, and the sixth light-emitting element are electrically connected to each other in series.

11. The light-emitting device according to claim 10,
wherein a first light-emitting element row comprising the first light-emitting element, the second light-emitting element, and the third light-emitting element and a second light-emitting element row comprising the fourth light-emitting element, the fifth light-emitting element, and the sixth light-emitting element are electrically connected to each other in parallel.

12. The light-emitting device according to claim 9, wherein a cross section of the separation layer has a shape in which a side in contact with a surface where the separation layer is formed is shorter than the opposite side.

13. The light-emitting device according to claim 9, wherein the substrate is made of organic resin or metal.

14. The light-emitting device according to claim 9, wherein the first wiring and the second wiring are formed of a conductive paste.

15. A lighting device comprising the light-emitting device according to claim 9.

16. A light-emitting device comprising:
a substrate;
a first wiring over the substrate;
an insulating film over the first wiring;
a second wiring over the insulating film; and
a first plurality of light-emitting elements comprising a first light-emitting element, a second light-emitting element, and a third light-emitting element over the insulating film, each of the first light-emitting element, the second light-emitting element, and the third light-emitting element comprising:
a first electrode;
an EL layer over the first electrode; and
a second electrode over the EL layer,
wherein the EL layer of the first light-emitting element and the EL layer of the second light-emitting element are separated from each other by a separation layer,
wherein the second electrode of the first light-emitting element and the second electrode of the second light-emitting element are separated from each other by the separation layer,
wherein the first electrode of the first light-emitting element is in contact with the first wiring,
wherein the second electrode of the first light-emitting element extends beyond an edge portion of the EL layer of the first light-emitting element,
wherein the second electrode of the first light-emitting element is in contact with the first electrode of the second light-emitting element,
wherein the second electrode of the third light-emitting element extends beyond an edge portion of the EL layer of the third light-emitting element,
wherein the second electrode of the third light-emitting element is in contact with the second wiring, and
wherein the first light-emitting element, the second light-emitting element, and the third light-emitting element are electrically connected to each other in series.

17. The light-emitting device according to claim 16, further comprising a second plurality of light-emitting elements comprising a fourth light-emitting element, a fifth light-emitting element, and a sixth light-emitting element over the insulating film,
wherein the fourth light-emitting element, the fifth light-emitting element, and the sixth light-emitting element are electrically connected to each other in series.

18. The light-emitting device according to claim 17, wherein the first plurality of light-emitting elements and the second plurality of light-emitting elements are electrically connected to each other in parallel.

19. The light-emitting device according to claim 16, wherein a cross section of the separation layer has a shape in which a side in contact with a surface where the separation layer is formed is shorter than the opposite side.

20. The light-emitting device according to claim 16, wherein the substrate is made of organic resin or metal.

21. The light-emitting device according to claim 16, wherein the first wiring and the second wiring are formed of a conductive paste.

22. A lighting device comprising the light-emitting device according to claim 16.

* * * * *